US006825568B2

United States Patent
Hung

(10) Patent No.: US 6,825,568 B2
(45) Date of Patent: Nov. 30, 2004

(54) FLIP CHIP PACKAGE STRUCTURE AND FLIP CHIP DEVICE WITH AREA BUMP

(75) Inventor: Chih-Pin Hung, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/605,012

(22) Filed: Sep. 1, 2003

(65) Prior Publication Data

US 2004/0113282 A1 Jun. 17, 2004

(30) Foreign Application Priority Data

Dec. 13, 2002 (TW) ...................................... 91220267 U

(51) Int. Cl.[7] .......................... H01L 23/48; H01L 23/52; H01L 29/40
(52) U.S. Cl. ........................ 257/778; 257/737; 257/738; 257/780
(58) Field of Search ............................ 257/778; 438/108

(56) References Cited

U.S. PATENT DOCUMENTS 5,749,510 A * 5/1998 Eifuku ..................... 228/122.1
5,818,113 A * 10/1998 Iseki et al. .................. 257/778
5,828,128 A * 10/1998 Higashiguchi et al. ...... 257/738
6,400,019 B1 * 6/2002 Hirashima et al. .......... 257/737
2002/0070438 A1 * 6/2002 Ference et al. ............. 257/685

* cited by examiner

Primary Examiner—John F. Niebling
Assistant Examiner—Angel Roman
(74) Attorney, Agent, or Firm—Jiang Chyun IP Office

(57) ABSTRACT

A structure of flip chip package with an area bump has at least a chip (also known as a die), a substrate, a plurality of first bumps (normal bumps) and at least a second bump (area bump), wherein the first bumps are electrically and mechanically connected to one of first bonding pads and the corresponding one of first contact pads. The second bump is electrically and mechanically connected to a second bonding pad and the corresponding second contact pad of the substrate, wherein the size of the second bump is larger than one of the first bumps. Because the size of the second bump is larger than one of the first bumps, the structure has much better electrical performance and performance of heat dissipation.

7 Claims, 2 Drawing Sheets

FLIP CHIP PACKAGE STRUCTURE AND FLIP CHIP DEVICE WITH AREA BUMP

CROSS REFERENCE TO RELATED APPLICATIONS

This application claims the priority benefit of Taiwan application Ser. No. 91220267, filed on Dec. 13, 2002.

BACKGROUND OF INVENTION

1. Field of Invention

The present invention relates to a flip chip package structure, and more particularly, to a flip chip package structure with an area bump.

2. Description of Related Art

The flip chip interconnect technology mainly disposes a plurality of bonding pads (also known as die pads) on an active surface of a chip (also known as a die) by using an area array layout method, and forms a bump on each bonding pad. After the chip is flipped, the bumps on the bonding pads of the chip are respectively electrically and mechanically connected to the contact pads, which correspond to the surface of a substrate or a Printed Circuit Board (PCB). Further, the flip chip interconnect technology also forms the bumps on the contact pads of the surface of the substrate or the PCB first, and electrically and mechanically connected to their corresponding bumps via the bonding pads on the active surface of the chip, respectively. It needs to be noted that since the flip chip interconnect technology can be applied in the high pin count chip package structure and is advantageous in reducing the package area and shorten the signal transmission path, the flip chip interconnect technology has been widely applied in the chip package field currently. The most common used chip package structures applying the flip chip interconnect technology comprise the chip package structures, such as the Flip Chip Ball Grid Array (FC/BGA) and the Flip Chip Pin Grid Array (FC/PGA).

Referring to both FIG. 1 and FIG. 2, FIG. 1 schematically shows a top view of a conventional flip chip package structure, and FIG. 2 schematically shows a sectional view cut from the I—I line in FIG. 1. The flip chip package structure 100 comprises a substrate 110, a chip 130, and a plurality of bumps 140. As shown in FIG. 2, the substrate 110 comprises a substrate surface 112 and a plurality of contact pads 114, wherein the contact pads 114 are disposed on the substrate surface 112 of the substrate 110. Further, the chip 130 comprises an active surface 132, wherein the active surface 132 of the chip 130 roughly means the surface on which the active devices (not shown) are disposed. The chip 130 further comprises a plurality of bonding pads 134, which disposed on the active surface 132 of the chip 130 and used as a media for input/output the signal of chip 130. The contact pads 114 are correspondingly disposed on the bonding pads 134, respectively. Further, the bumps 140 electrically and mechanically connect one of the bonding pads 134 to one of its corresponding contact pads 114, respectively. Finally, an underfill 150 is filled into the cavity surrounded by the substrate 110, the chip 130, and the bumps 140, so as to protect the exposed portion of the contact pads 114, the bonding pads 134, and the bumps 140.

Regarding to the conventional flip chip interconnect technology, the bonding pads of the chip, which provide the functions of signal, power and ground, are electrically and mechanically connected to their corresponding contact pads of the substrate via the same size ball bumps, respectively. It needs to be noted that the electrical performance and the heat dissipation performance are constant for the same size bumps, thus it is hardly achieved the object of improving the electrical performance and the heat dissipation performance by using the same size bumps after the chip is packaged. Therefore, if the designer intends to significantly improve the electrical performance and the heat dissipation performance after the chip is packaged, a new structure has to be developed.

SUMMARY OF INVENTION

It is an object of the present invention to provide a flip chip package structure with an area bump, in which the bump can be designed as any shape in its cross direction based on the special electrical requirement of the chip, so as to improve the electrical performance and the heat dissipation performance after the chip is packaged.

A flip chip package structure with an area bump provided by the present invention comprises a substrate, at least a chip, a plurality of first bumps (normal bumps), and at least a second bump (area bump). The substrate comprises a substrate surface, a plurality of first contact pads, and at least a second contact pad, wherein the size of the second contact pad is larger than one of the first contact pads. The chip further comprises an active surface, a plurality of first bonding pads, and at least a second bonding pad, wherein the size of the second bonding pad is larger than one of the first bonding pads. The first bump is respectively connected to one of the first bonding pads and the corresponding one of the first contact pads. Further, the second bump is connected to the second bonding pad and the second contact pad, wherein the size of the second bump is larger than one of the first bumps.

In accordance with the preferred embodiment of the present invention, the size of the second bump can be two times of size of one of the first bumps. Further, the first bumps can be disposed on the periphery of the second bump, wherein the first bonding pad may be such as the signal bonding pad, the power bonding pad, or the ground bonding pad, and the second bonding pad may be such as the power bonding pad, the ground bonding pad, or the special signal bonding pad. Furthermore, an underfill is filled into the cavity surrounded by the chip, the first bumps, the second bumps, and the substrate.

Therefore, with the flip chip package structure with an area bump provided by the present invention, multiple bumps in the same group originally connected to the power or ground are integrated into a bump by changing the shape of the bump in its cross direction, so as to increase the electric conductive area and the heat dissipation area for the multiple bumps before they are integrated, and further improve the electrical performance and the heat dissipation performance after the chip is packaged.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 3:
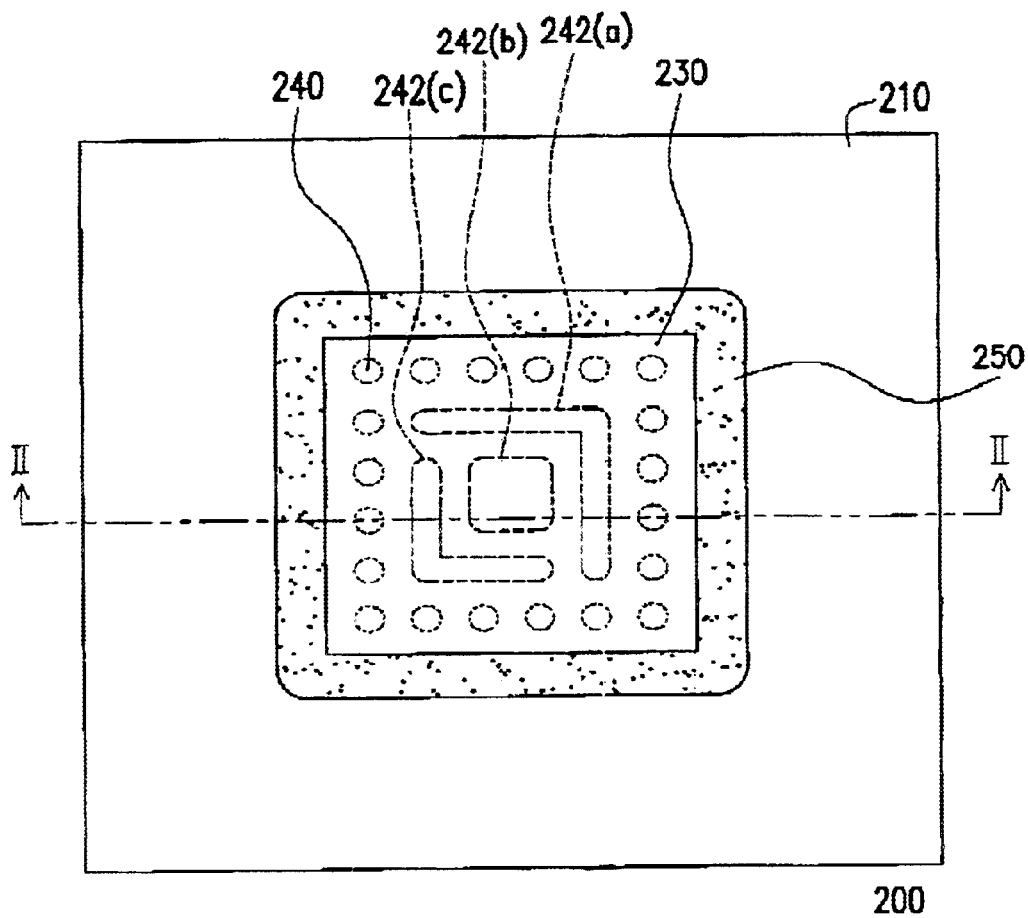
FIG. 3 schematically shows a top view of a flip chip package structure of a preferred embodiment according to the present invention.
Figure 4:
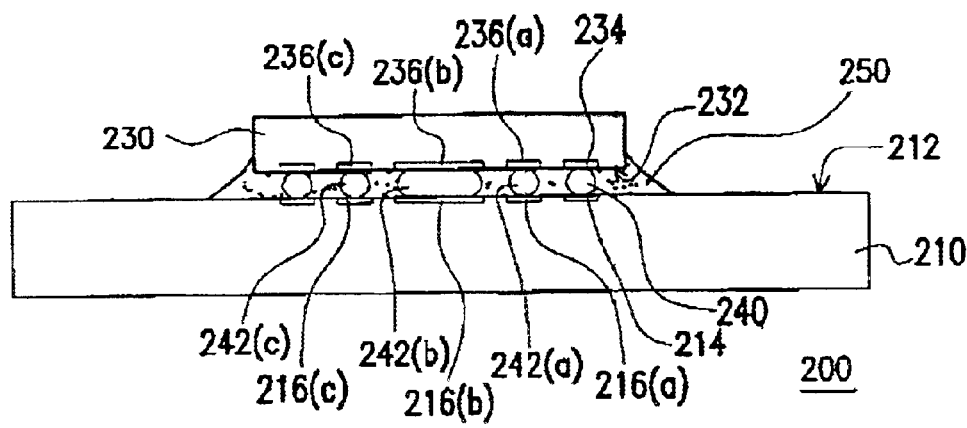
FIG. 4 schematically shows a sectional view cut from the II—II line in FIG. 3.

Referring to both FIG. 3 and FIG. 4, wherein FIG. 3 schematically shows a top view of a flip chip package structure of a preferred embodiment according to the present invention, and FIG. 4 schematically shows a sectional view cut from the II—II line in FIG. 3. The flip chip package structure 200 comprises a substrate 210, a chip 230, and a plurality of bumps. The bumps comprise a plurality of first bumps and a plurality of second bumps, wherein the first bumps are the normal bumps 240, and the second bumps are at least an area bump 242. As shown in FIG. 4, the substrate 210 comprises a substrate surface 212, a plurality of contact pads 214, and a plurality of area contact pads 216, wherein the contact pads 214 and the area contact pads 216 are disposed on the substrate surface 212 of the substrate 210. Further, the chip 230 comprises an active surface 232, wherein the active surface 232 of the chip 230 roughly means the surface on which the active element (not shown) is disposed. The chip 230 further comprises a plurality of bonding pads 234 and a plurality of area bonding pads 236, wherein the bonding pads 234 and the area bonding pads 236 are disposed on the active surface 232 of the chip 230. Wherein, the positions of the bonding pads 234 and the area bonding pads 236 are respectively corresponding to the positions of the contact pads 214 and the area contact pads 216. Further, the bumps 240 are respectively electrically and mechanically connected to one of the bonding pads 234 and the corresponding one of the contact pads 214, and the area bumps 242 are respectively electrically and mechanically connected to the area bonding pads 236 and its corresponding area contact pads 216.

Referring to FIG. 4, an underfill 250 is filled into the space surrounded by the substrate 210, the chip 230, the bumps 240, and the area bumps 242, so as to protect the exposed portion of the bumps 240 and the area bumps 242, and provide an appropriate elastic buffer between the substrate 210 and the chip 230. Therefore, the bonding pads 234 of the chip 230 are electrically and mechanically connected to the contact pads 214 of the substrate 210 via the bumps 240 respectively, and the area bonding pads 236 of the chip 230 are electrically and mechanically connected to the area contact pads 216 of the substrate 210 via the area bumps 242 respectively.

Referring to FIG. 4, the bonding pads 234 can be used as the media for transmitting the signal of the chip 230 or connecting to the power or the ground, thus the bonding pads 234 may be the signal bonding pads, the power bonding pads or the ground bonding pads. The area bonding pads 236 may be used as the transmission media of the chip 230 for connecting to the power or the ground, thus the area bonding pads 236 may be the power bonding pads or the ground bonding pads. Wherein, the size of the area bonding pads 236 is larger than one of the bonding pads 234. It needs to be noted that once a larger current conductive area is needed for transmitting a special signal, the area bonding pads 236 also can be used as the transmission media for this special signal, thus it may be the special signal bonding pads. Further, since the area bumps 242 must provide a larger current conductive area, the size of the area bumps 242 must be larger than one of the bumps 240, and the size of both bumps can be even more than two times differing from each other. Furthermore, since most of the circuit layout of the chip 230 gathers the power and the ground in the center portion of the chip 230, most of the bumps 240 are disposed on the periphery of the area bumps 242.

Figure 1:
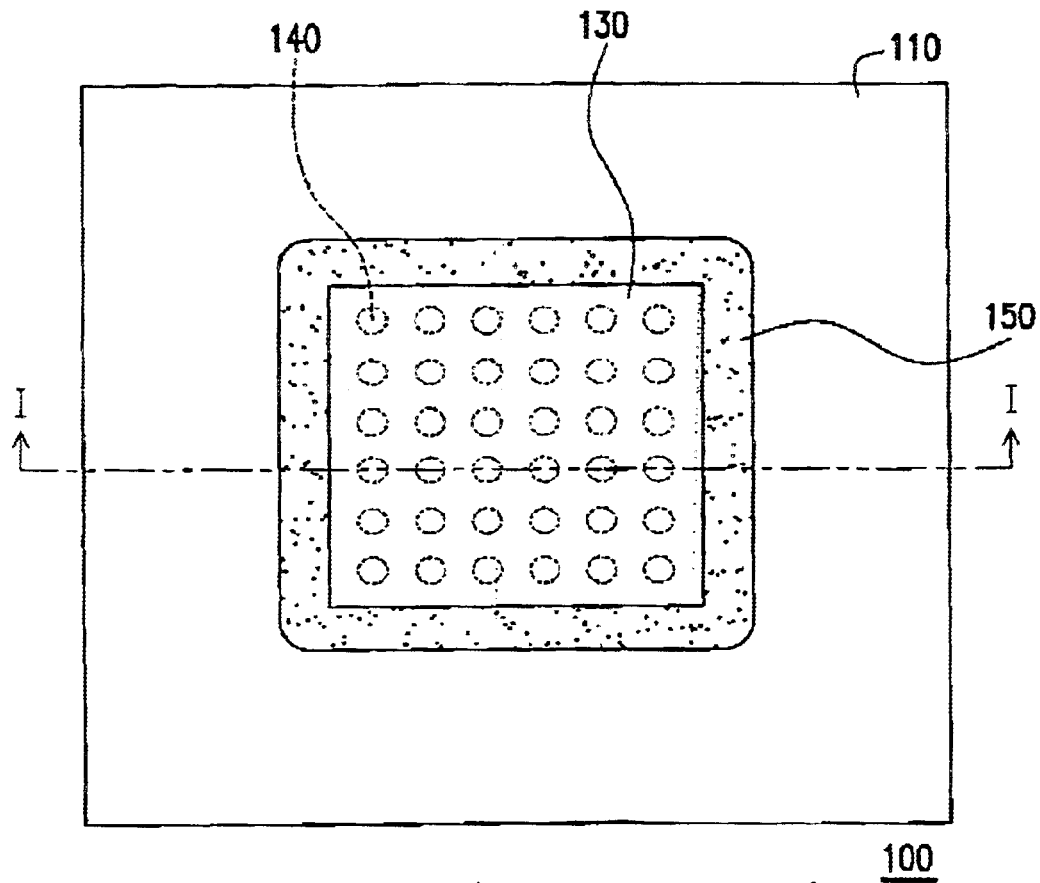
FIG. 1 schematically shows a top view of a conventional flip chip package structure.
Figure 2:
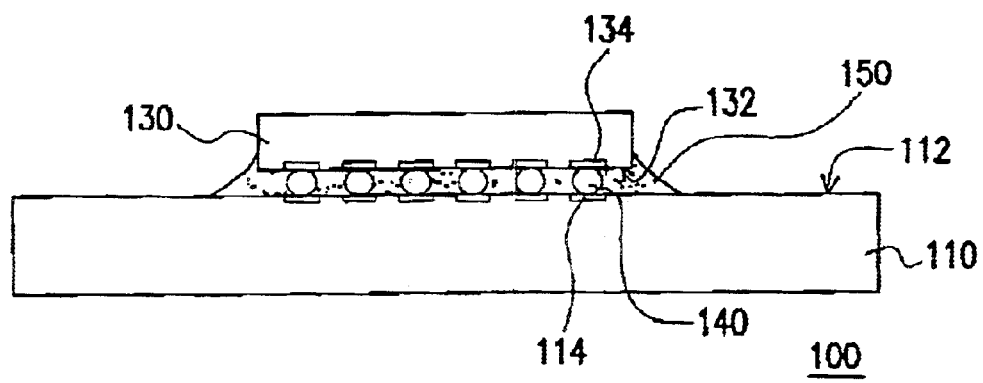
FIG. 2 schematically shows a sectional view cut from the I—I line in FIG. 1.

Referring to FIG. 4, since most of the bonding pads 134 shown in FIG. 2, which are used for connecting to the power or the ground in the prior art, are disposed in a grouping manner on the center portion of the active surface 132 of the chip 134, the horizontal shape of the area bonding pad 236a, 236c may be such as an "L" shape, so as to replace the original layout of the bonding pads, which are used for connecting to the power or the ground in the prior art. The horizontal shape of the area bonding pad 236b may be such as a rectangle, so as to replace the original layout of the bonding pads, which are used for connecting to the power or the ground in the prior art. Therefore, the horizontal shape of the area bumps 242 is corresponded to the horizontal shape of the area bonding pads 236, such as an "L" shape or a rectangle shape, or even other shapes. Furthermore, the size of the area contact pads 216 is larger than one of the contact pads 214, and the contact pads 214 are correspondingly disposed on the periphery of the area contact pads 216. The horizontal shape of the area contact pad 216a, 216c may be such as an "L" shape, and the horizontal shape of the area contact pad 216b may be such as a rectangle. Based on the descriptions above, the area bonding pads 236 and its corresponding area contact pads 216 may have the same horizontal shape and different size.

Referring to FIG. 4, if the area bonding pads 236 are the power bonding pads or the ground bonding pads, since the size of the area bonding pads 236 is larger, and the size of its corresponding area bumps 242 and the corresponding area contact pads 216 are relatively larger, thus it can provide a bigger current conductive area, so as to improve the electrical performance of the chip 230 after it is packaged. Further, since the size of the area contact pads 216 is larger, the heat conductive area of the area contact pads 216 is also increased, so as to improve the heat dissipation performance of the chip 230 after it is packaged.

However, it will be apparent to one of ordinary skill in the art that the area bonding pad of the chip is not necessarily limited to the power bonding pad or the ground bonding pad. For the special signal, which needs a larger current conductive area, the area bonding pad of the chip according to the present invention may be used as a special signal bonding pad mentioned above, so as to fulfill the electrical requirement when the chip is being designed. Therefore, the area bonding pad may be a power bonding pad, a ground bonding pad, or a special signal bonding pad.

Based on the descriptions above, the flip chip package structure with an area bump provided by the present invention comprises a substrate, at least a chip, a plurality of first bumps (normal bumps), and at least a second bump (area bump). The second bump is connected to the second bonding pad and the second contact pad, and the size of the second bump is larger than one of the first bumps. It needs to be noted that since the size of the second bump is larger than one of the first bumps, the structure has much better electrical performance and performance of heat dissipation.

In summary, the flip chip package structure with an area bump provided by the present invention has following advantages: (1) The bumps of the flip chip package structure with an area bump of the present invention can be designed as any shape in its cross direction based on the special electrical requirement of the chip. Therefore, the electrical performance of the chip is improved after it is packaged, and the flip chip package structure of the present invention can be used in the electronic product having special electrical requirement. (2) The size of the area bump of the flip chip package structure with an area bump of the present invention is larger (compared to the normal bump). Therefore, the heat dissipation performance of the chip is improved after it is packaged, and the flip chip package structure of the present invention can be used in the electronic product having high power consumption.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A flip chip package structure, comprising:
    a substrate comprising a first surface, a plurality of first contact pads and at least a second contact pad on the first surface, wherein a size of the second contact pad is larger than that of one of the first contact pads;
    at least a chip, comprising an active surface, a plurality of first bonding pads and at least a second bonding pad on the active surface, wherein a size of the second bonding pad is larger than that of one of the first bonding pads;
    a plurality of first bumps, respectively connecting one of the first bonding pads to the corresponding one of the first contact pads; and
    at least a second bump, connecting the second bonding pad to the second contact pad, wherein a size of the second bump is larger than a size of one of the first bumps and the first bumps are disposed around a periphery of the second bump.

2. The flip chip package structure of claim 1, wherein the size of the second bump is twice the size of one of the first bumps.

3. The flip chip package structure of claim 1, wherein the first bonding pad is selected from the group consisting of a signal bonding pad, a power bonding pad, and a ground bonding pad.

4. The flip chip package structure of claim 1, wherein the second bonding pad is selected from the group consisting of a power bonding pad, a ground bonding pad, and a special signal bonding pad.

5. The flip chip package structure of claim 1, further comprising an underfill filled into a cavity that is surrounded by the substrate, the chip, the first bumps, and the second bump.

6. A flip chip device, comprising:
    a chip comprising an active surface, a plurality of first bonding pads and at least a second bonding pad on the active surface, wherein a size of the second bonding pad is larger than that of one of the first bonding pads;
    a plurality of first bumps, respectively connected to one of the first bonding pads; and
    at least a second bump, connected to the second bonding pad, wherein a size of the second bump is larger than a size of one of the first bumps and the first bumps are disposed around a periphery of the second bump.

7. The flip chip device of claim 6, wherein the size of the second bump is twice the size of one of the first bumps.

* * * * *